(12) United States Patent
Guo et al.

(10) Patent No.: US 9,691,612 B2
(45) Date of Patent: Jun. 27, 2017

(54) PROCESS FOR PREPARING GRAPHENE ON A SIC SUBSTRATE BASED ON METAL FILM-ASSISTED ANNEALING

(75) Inventors: Hui Guo, Xi'an (CN); Keji Zhang, Xi'an (CN); Yuming Zhang, Xi'an (CN); Pengfei Deng, Xi'an (CN); Tianmin Lei, Xi'an (CN)

(73) Assignee: Xidian University, Xi'an, Shaanxi (CN)

( * ) Notice: Subject to any disclaimer, the term of this patent is extended or adjusted under 35 U.S.C. 154(b) by 417 days.

(21) Appl. No.: 14/369,780

(22) PCT Filed: Sep. 3, 2012

(86) PCT No.: PCT/CN2012/080928
§ 371 (c)(1),
(2), (4) Date: Jun. 30, 2014

(87) PCT Pub. No.: WO2013/102359
PCT Pub. Date: Jul. 11, 2013

(65) Prior Publication Data
US 2014/0367642 A1 Dec. 18, 2014

(30) Foreign Application Priority Data
Jan. 3, 2012 (CN) .......................... 2012 1 0000519

(51) Int. Cl.
*H01L 21/02* (2006.01)
*C23C 16/26* (2006.01)
(Continued)

(52) U.S. Cl.
CPC ........ *H01L 21/02614* (2013.01); *B82Y 30/00* (2013.01); *B82Y 40/00* (2013.01);
(Continued)

(58) Field of Classification Search
CPC ........... H01L 21/02527; H01L 29/1606; C23C 14/0605; C30B 25/02
See application file for complete search history.

(56) References Cited

U.S. PATENT DOCUMENTS 4,076,574 A * 2/1978 Pastor .................... C30B 11/00
117/76
5,562,952 A * 10/1996 Nakahigashi ......... C23C 16/405
118/50
(Continued)

FOREIGN PATENT DOCUMENTS

CN 1716522 1/2006
CN 101872120 10/2010
(Continued)

*Primary Examiner* — Matthew Song
(74) *Attorney, Agent, or Firm* — McDonnell Boehnen Hulbert & Berghoff LLP

(57) ABSTRACT

Provided is a process for preparing graphene on a SiC substrate, based on metal film-assisted annealing, comprising the following steps: subjecting a SiC substrate to a standard cleaning process; placing the cleaned SiC substrate into a quartz tube and heating the quartz tube up to a temperature of 750 to 1150° C.; introducing $CCl_4$ vapor into the quartz tube to react with SiC for a period of 20 to 100 minutes so as to generate a double-layered carbon film, wherein the $CCl_4$ vapor is carried by Ar gas; forming a metal film with a thickness of 350 to 600 nm on a Si substrate by electron beam deposition; placing the obtained double-layered carbon film sample onto the metal film; subsequently annealing them in an Ar atmosphere at a temperature of 900 to 1100° C. for 10-30 minutes so as to reconstitute the double-layered carbon film into double-layered graphene; and removing the metal film from the double-layered graphene, thereby obtaining double-layered graphene. Also provided is double-layered graphene prepared by said process.

8 Claims, 2 Drawing Sheets

(51) Int. Cl.

| | | |
|---|---|---|
| *C23C 16/01* | (2006.01) | |
| *C23C 16/02* | (2006.01) | |
| *C01B 31/04* | (2006.01) | |
| *B82Y 30/00* | (2011.01) | |
| *B82Y 40/00* | (2011.01) | |
| *H01L 29/16* | (2006.01) | |
| *C30B 25/02* | (2006.01) | |
| *C23C 14/06* | (2006.01) | |

(52) U.S. Cl.
CPC .......... *C01B 31/0446* (2013.01); *C23C 16/01* (2013.01); *C23C 16/0281* (2013.01); *C23C 16/26* (2013.01); *H01L 21/02378* (2013.01); *H01L 21/02527* (2013.01); *H01L 21/02661* (2013.01); *H01L 21/02664* (2013.01); *H01L 29/1606* (2013.01); *C01B 2204/04* (2013.01); *C23C 14/0605* (2013.01); *C30B 25/02* (2013.01)

(56) References Cited

U.S. PATENT DOCUMENTS

| | | | |
|---|---|---|---|
| 8,361,813 B1* | 1/2013 | Niyogi | H01L 21/02422 257/E51.04 |
| 8,697,230 B2 | 4/2014 | Ago et al. | |
| 2011/0059599 A1* | 3/2011 | Ward | B82Y 30/00 438/507 |
| 2014/0106561 A1* | 4/2014 | Niyogi | C23C 14/042 438/643 |
| 2014/0256120 A1 | 9/2014 | Guo et al. | |

FOREIGN PATENT DOCUMENTS

| | | |
|---|---|---|
| CN | 102505114 A | 6/2012 |
| CN | 102505140 A | 6/2012 |
| CN | 102505141 | 6/2012 |
| CN | 102530936 | 7/2012 |
| CN | 102583325 A | 7/2012 |
| CN | 102583330 A | 7/2012 |
| CN | 102583331 A | 7/2012 |
| CN | 102674329 | 9/2012 |
| CN | 102701789 | 10/2012 |
| CN | 102723258 | 10/2012 |
| JP | 2011178617 | 9/2011 |

* cited by examiner

PROCESS FOR PREPARING GRAPHENE ON A SIC SUBSTRATE BASED ON METAL FILM-ASSISTED ANNEALING

CROSS-REFERENCE TO RELATED APPLICATIONS

This application is the National Stage of International Application No. PCT/CN2012/080928, filed Sep. 3, 2012, which claims priority to Chinese Application No. CN2013/10000519, filed Jan. 3, 2012.

FIELD OF THE INVENTION

The present invention belongs to the field of microelectronics, and relates to semiconductor films and their preparation methods. Specifically, the present invention relates to a process for preparing graphene on a SiC substrate based on metal film-assisted annealing.

BACKGROUND

It was in 2004 that graphene first appeared in the laboratory, when scientists Andre Geim and Kostya Novoselov at the University of Manchester discovered that they could get a graphite flake which became thinner and thinner by a very simple method. They isolated a graphite flake from graphite, then stuck both sides of the flake to a special tape and peeled the tapes off, thereby cleaving the graphite flake into two parts. As they repeated this process several times, the flakes got thinner and thinner. Finally, they obtained a monolayer of carbon, which is known as graphene. From then on, numerous new methods have been explored to prepare graphene, among which the following two methods are most commonly used.

1. Chemical vapor deposition provides a controllable and effective method for preparing graphene. In a Chemical vapor deposition method, a flat substrate (such as a metal film, a monocrystal metal or the like) is exposed to the atmosphere of a precursor (such as methane and ethylene etc.) which is decomposable at high temperatures, then allowing carbon atoms to deposit on the surface of the substrate by annealing them at high temperatures so as to form graphene. Consequently, isolated graphene flakes are obtained by employing a chemical etching method to remove the metal substrate. The growth of graphene (such as growth rate, thickness and flake area etc.) can be controlled by selecting the parameters such as the type of the substrate, the growing temperature and the mass flow etc. However, the biggest disadvantage of this method is that the strong interaction between the graphene flakes and the substrate leads to a loss of many characteristics of the graphene monolayer, and weakens the continuity of the graphene.

2. Thermal decomposition of SiC provides another method for preparing graphene. In this method, monocrystal SiC is heated to make the SiC on the surface decompose so as to remove Si and form graphene by the residual carbon. However, the monocrystal SiC used in the SiC thermal decomposition is very expensive, and the graphene as grown takes on island-like morphologies and is porous, with the number of the graphene layers being non-uniform.

An example of the methods which are widely used now to prepare graphene is disclosed in Patent Literature 1: Firstly preparing a catalyst; then carrying out high-temperature chemical vapor deposition by loading a substrate into an oxygen-free reaction vessel, wherein the substrate carries a catalyst, heating the substrate to a temperature of 500 to 1200° C., and introducing a source of carbon-containing gas to begin the chemical deposition so as to generate graphene; followed by purifying the graphene to remove the catalyst by acid treatment or evaporation under low pressure and at high temperature. Nevertheless, this method has many drawbacks such as the complexity of the process, an additional removal of the catalyst being required, high energy consumption and high production cost.

Patent Literature 1: Chinese Patent Application No. CN101285175A.

SUMMARY

An object of the present invention is to overcome the aforementioned problems existing in the prior art by providing a process for preparing graphene on a SiC substrate based on metal film-assisted annealing, so as to improve the surface smoothness and the continuity of graphene and reduce the porosity.

In order to achieve the above-mentioned object, the process for preparing graphene according to the present invention comprises the following steps:

(1) subjecting a SiC substrate to a standard cleaning process so as to remove contaminants from the surface of the SiC substrate;

(2) placing the cleaned SiC substrate into a quartz tube and heating the quartz tube up to a temperature of 750 to 1150° C., and introducing $CCl_4$ vapor into the quartz tube to react with SiC for a period of 20 to 100 minutes so as to generate a double-layered carbon film, wherein the $CCl_4$ vapor is carried by Ar gas;

(3) forming a metal film with a thickness of 350 to 600 nm on a Si substrate by electron beam deposition, wherein the metal film is capable of catalyzing carbon to reconstitute into graphene;

(4) placing the obtained double-layered carbon film sample onto the metal film, and subsequently annealing them in an Ar atmosphere at a temperature of 900 to 1100° C. for 10-30 minutes so as to reconstitute the double-layered carbon film into double-layered graphene; and (5) removing the metal film from the double-layered graphene, thereby obtaining double-layered graphene.

Another object of the present invention is to provide double-layered graphene of excellent properties prepared by the aforementioned process.

The advantages of the present invention over the prior art include:

1. The process for preparing graphene according to the present invention provides a simply and energy-efficient process.

2. Attributed to the reaction between SiC and $CCl_4$, the double-layered carbon film as formed in the present invention has a smooth surface and low porosity, and the graphene obtained therefrom can be used in gas sealing and liquid sealing.

3. It is on the metal film that the annealing occurs according to the present invention, which facilitates the reconstitution of the obtained carbon film into graphene with better continuity.

4. The graphene prepared according to the present preparation process can be easily peeled off from the metal film, without special catalyst-removing process, which greatly simplifies the process and improves the graphene quality.

DETAILED DESCRIPTION OF THE INVENTION

Figure 1:
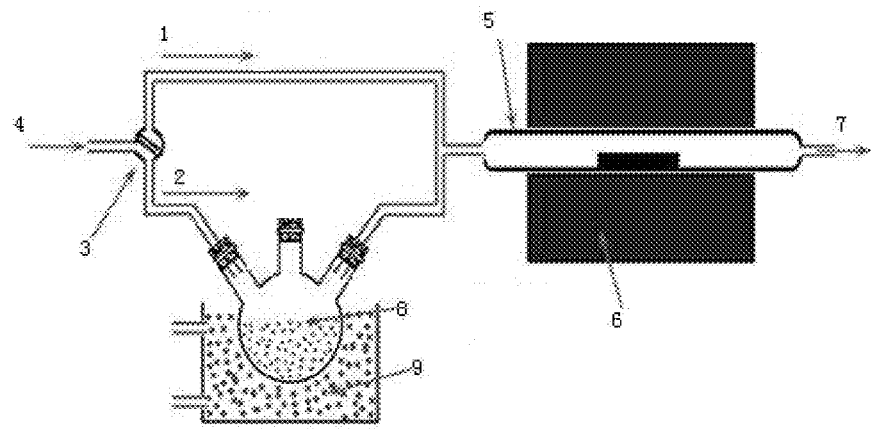
FIG. 1 is a schematic view of the device used to prepare graphene in accordance with the present invention.

As shown in FIG. 1, the device which is used to prepare graphene in accordance with the present invention mainly consists of a three-necked flask 8, a three-way valve 3, a water bath 9, a quartz tube 5 and a resistance furnace 6. The three-way valve 3 is connected to a gas inlet 4, an end of the quartz tube 5 through a first channel 1, and the left neck of the three-necked flask 8 through a second channel 2, respectively. The right neck of the three-necked flask 8 is connected with the end of the quartz tube 5, which end is also connected the three-way valve 3, with the other end of the quartz tube 5 being a gas outlet 7. The three-necked flask 8 which contains $CCl_4$ liquid is placed in the water bath 9. The quartz tube 5 is located in the resistance furnace 6.

Figure 2:
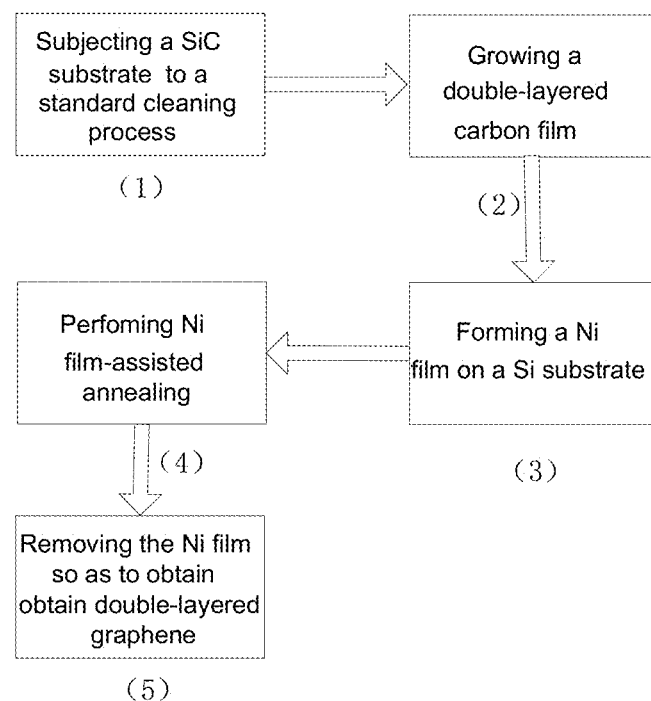
FIG. 2 is a flow diagram schematically representing the process for preparing graphene in accordance with the present invention.

The process for preparing graphene on a SiC substrate based on metal film-assisted annealing in accordance with the present invention will be illustrated below in detail with reference to FIG. 2.

Step (1): a SiC substrate is subject to a standard cleaning process. Specifically, a monocrystal SiC in a crystal form of 4H—SiC or 6H—SiC may be used as the SiC substrate. For the purpose of removing contaminants from the surface of the SiC substrate, ammonium hydroxide-hydrogen peroxide ($NH_4OH+H_2O_2$) and hydrochloric acid-hydrogen peroxide ($HCl+H_2O_2$) may be used to remove organic residues and ionic contaminants from the SiC substrate, respectively.

Step (2): Subsequently, the cleaned SiC substrate is placed into a quartz tube and the quartz tube is heated up to a temperature of 750 to 1150° C. Then $CCl_4$ vapor is introduced into the quartz tube to react with SiC for a period of 20 to 100 minutes, wherein the $CCl_4$ vapor is carried by Ar gas. The $CCl_4$ first decomposes into carbon and chlorine gas ($Cl_2$) at the high temperature. The resultant carbon deposits on the SiC surface, and the resultant $Cl_2$ undergoes a chlorination reaction with the SiC to form carbon and $SiCl_4$, thereby a double-layered carbon film is obtained.

If the $CCl_4$ vapor reacts with the SiC for a period of less than 20 minutes, the time is too short to react sufficiently, making it impossible to produce carbon film on a large scale. On the other hand, if the reaction lasts more than 100 minutes, carbon generated from $CCl_4$ will cover the whole surface of the SiC substrate and consequently prevent $Cl_2$ from reacting with SiC, which means that the reaction cannot take place any longer. Therefore, the reaction time is set to 20 to 100 minutes, preferably 50 to 70 minutes.

There is no specific limitation to the $CCl_4$ vapor which functions as the source of carbon-containing gas. For example, the $CCl_4$ vapor may be obtained by heating the three-necked flask which contains $CCl_4$ liquid to a temperature of 60 to 90° C. in the device as shown in FIG. 1. Due to the fact that the boiling point of $CCl_4$ liquid is 76.8° C., it begin to release small amount of vapor when heated to 60° C. Meanwhile, it will emit too much $CCl_4$ gas at a temperature above 90° C. In view of such, it is preferable to heat to a temperature in the range of 60 to 90° C., more preferable 75 to 80° C.

In addition, it is preferred to set the flow rate of Ar gas in step (2) to 40 to 90 ml/min, more preferably 60 to 70 ml/min. Ar gas carries insufficient $CCl_4$ at a flow rate of less than 40 ml/min and the reaction proceeds slowly, while Ar gas at a flow rate of more than 90 ml/min carries redundant $CCl_4$ and the reaction is relatively quick, rendering the carbon film not dense.

Step (3): a metal film with a thickness of 350 to 600 nm is formed on a Si substrate by electron beam deposition or other methods such as sputtering and plating.

Any metal film can be arbitrarily used so long as it can catalyze the carbon film to reconstitute into graphene. Examples of the metal film include nickel (Ni) film and copper (Cu) film. Ni film is preferable in terms of reactivity.

Ni film may be formed under conventional conditions for electron beam deposition. For example, the distance between the SiC substrate and the target may be set to 50 cm, the chamber pressure may be $5\times10^{-4}$ Pa, the beam current may be 40 mA, and the evaporation time may be 10 to 20 minutes. The thickness of the metal film is controlled by the evaporation time. Considering that the resultant carbon film partially dissolves in the Ni film, the Ni film shouldn't be too thick. The thickness of the Ni film is preferably controlled to 350 to 600 nm.

Step (4): the double-layered carbon film sample as obtained is then placed onto the metal film so that the carbon film and the metal film are opposite to each other, and subsequently annealing them in an Ar atmosphere at a temperature of 900 to 1100° C. for 10-30 minutes so as to reconstitute the double-layered carbon film into double-layered graphene.

During the above annealing, an appropriate annealing temperature for the carbon film to reconstitute into graphene is 900 to 1100° C. It cannot offer enough energy for the reconstitution of the carbon film when the temperature is too low, while a too-high temperature leads to non-uniform reconstitution and lots of defects. Furthermore, it is preferable that the annealing time is 10 to 30 minutes. In the case where the annealing time is too short, the quality of the graphene is poor due to the presence of many pores. When the annealing is prolonged, the number of pores in the sample will decrease and the surface of the sample becomes flatter. However, if the time is too long, it will give rise to new defects and deteriorate the graphene quality.

Additionally, there is no specific limitation to the flow rate of the Ar gas during annealing, which mainly depends on the size of the annealing chamber and the size of the substrate. Preferably, the flow rate of the Ar gas during annealing is 20 to 100 ml/min When the sample is thermally treated under the protection of Ar gas, the chlorine gas absorbed in the sample can be desorbed and it also provides protection to the metal film.

Step (5): finally, the metal film is removed from the double-layered graphene so as to obtain double-layered graphene.

The process for preparing graphene according to the present invention provides a simple and energy-efficient process.

In the inventive process for preparing graphene, the vapor deposition of the carbon film directly takes place on the SiC substrate without using metal catalyst, making it unnecessary to additionally remove catalyst. At the same time, the graphene layer as formed after annealing the carbon film on the metal film can be easily peeled off from the metal film. As a result, the present invention greatly simplifies the process and improves the graphene quality.

Also, attributed to the reaction between SiC and $CCl_4$, the double-layered carbon film as formed in the present invention has a smooth surface and a low porosity, and the graphene obtained therefrom can be used in gas sealing and liquid sealing. It is on the metal film that the metal film-assisted annealing occurs according to the present invention, which facilitates the reconstitution from the obtained carbon film into graphene with better continuity.

Figure 3:
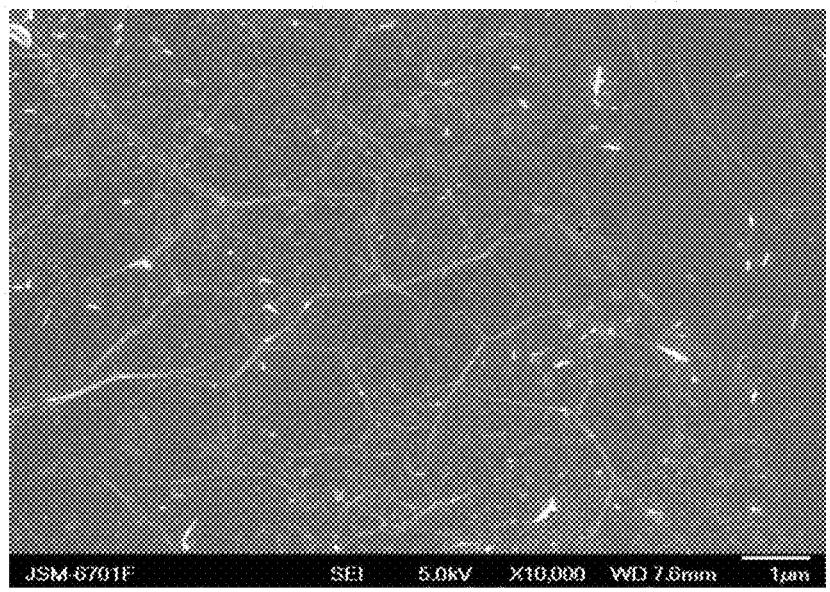
FIG. 3 is a SEM photograph of the graphene in accordance with the present invention.

FIG. 3 shows a SEM photograph of the graphene obtained by the preparation process of the present invention. It can be seen that the graphene formed according to the process of the present invention has a smooth surface, a low porosity and a dense film surface.

The process for preparing graphene in accordance with the present invention is described below in more detail by means of the following three examples, wherein theses examples serve solely to illustrate the preparing method of the present invention and the specific conditions do not constitute any restriction to the present invention.

EXAMPLE 1

Step 1: a 6H—SiC substrate was cleaned so as to remove contaminants from its surface.

(1.1) the 6H—SiC substrate sample was immersed in $NH_4OH+H_2O_2$ for 10 minutes, taken out and dried so as to remove organic residues from the surface of the sample; and (1.2) the 6H—SiC substrate sample was then immersed in $HCl+H_2O_2$ for 10 minutes, taken out and dried so as to remove ionic contaminants.

Step 2: a quartz tube was loaded with the cleaned 6H—SiC substrate, degassed and heated.

(2.1) the cleaned 6H—SiC was placed into the quartz tube 5, and the quartz tube 5 was placed into the resistance furnace 6;

(2.2) the air tightness of the whole preparation device was checked, then Ar gas was introduced from the gas inlet 4 at a flow rate of 80 ml/min, while controlling Ar gas to enter into the quartz tube through the first channel 1 by the three-way valve 3, and the quartz tube was degassed for 30 minutes so as to discharge the air inside the quartz tube from the gas outlet 7;

(2.3) the power of the resistance furnace 6 was turned on to elevate the temperature of the quartz tube to 750° C.

Step 3: growing a double-layered carbon film.

(3.1) the power of the water bath 9 was turned on so as to heat the three-necked flask 8 containing $CCl_4$ liquid to 60° C.;

(3.2) the three-way valve was rotated when the temperature of the resistance furnace reached a predetermined temperature of 750° C. so that Ar gas entered into the three-necked flask through the second channel 2 at a flow rate of 40 ml/min and carried $CCl_4$ vapor into the quartz tube, allowing gaseous $CCl_4$ to react with 6H—SiC in the quartz tube for 20 minutes, thereby generating a double-layered carbon film.

Step 4: a Si substrate was loaded on the slide of an electron beam evaporation coating machine, wherein the distance between the substrate and the target was set to 50 cm, the chamber pressure was pumped to $5\times10^{-4}$ Pa, the beam current was adjusted to 40 mA, and the evaporation lasted for 10 minutes. As a result, a metal film of Ni with a thickness of 350 nm was deposited on the Si substrate.

Step 5: reconstituting into a double-layered graphene.

(5.1) the resultant double-layered carbon film sample was taken out of the quartz tube and placed onto the metal film;

(5.2) the double-layered carbon film sample and the metal film as a whole were annealed in an Ar atmosphere (flow rate: 20 ml/min) at 900° C. for 20 minutes so as to catalyze the carbon film to reconstitute into continuous graphene by metal Ni; and (5.3) the metal film was removed from the double-layered graphene sample.

EXAMPLE 2

Step 1: a 4H—SiC substrate was cleaned so as to remove contaminants from its surface.

The 4H—SiC substrate sample was firstly immersed in $NH_4OH+H_2O_2$ for 10 minutes, taken out and dried so as to remove organic residues from the surface of the sample; and then the sample was immersed in $HCl+H_2O_2$ for 10 minutes, taken out and dried so as to remove ionic contaminants.

Step 2: a quartz tube was loaded with the cleaned 4H—SiC substrate, degassed and heated.

The cleaned 4H—SiC was placed into the quartz tube 5, and the quartz tube was placed into the resistance furnace 6; the air tightness of the whole preparation device was checked, then Ar gas was introduced from the gas inlet 4 at a flow rate of 80 ml/min, while controlling Ar gas to enter into the quartz tube through the first channel 1 by the three-way valve 3, and the quartz tube was degassed for 30 minutes so as to discharge the air inside the quartz tube from the gas outlet 7; and the power of the resistance furnace 6 was turned on to elevate the temperature of the quartz tube to 900° C.

Step 3: growing a double-layered carbon film. The power of the water bath 9 was turned on so as to heat the three-necked flask 8 containing $CCl_4$ liquid to 70° C.; the three-way valve was rotated when the temperature of the resistance furnace reached a predetermined temperature of 900° C. so that Ar gas entered into the three-necked flask through the second channel 2 at a flow rate of 60 ml/min and carried $CCl_4$ vapor into the quartz tube, allowing gaseous $CCl_4$ to react with 4H—SiC in the quartz tube for 60 minutes, thereby generating a double-layered carbon film.

Step 4: a Si substrate was loaded on the slide of an electron beam evaporation coating machine, wherein the distance between the substrate and the target was set to 50 cm, the chamber pressure was pumped to $5\times10^{-4}$ Pa, the beam current was adjusted to 40 mA, and the evaporation lasted for 15 minutes. As a result, a metal film of Ni with a thickness of 400 nm was deposited on the Si substrate.

Step 5: reconstituting into a double-layered graphene.

The resultant double-layered carbon film sample was taken out of the quartz tube and placed onto the metal film; followed by annealing the carbon film sample and the metal film as a whole in an Ar atmosphere (flow rate: 60 ml/min) at 1000° C. for 15 minutes so as to catalyze the carbon film to reconstitute into continuous graphene by metal Ni; and the metal film was removed from the double-layered graphene sample.

EXAMPLE 3

Step A: the surface of a 6H—SiC substrate was cleaned by firstly immersing the substrate sample in $NH_4OH+H_2O_2$ for 10 minutes, taking it out and drying it so as to remove organic residues from the surface of the substrate sample substrate; and then immersing the sample in $HCl+H_2O_2$ for 10 minutes, taking it out and drying it so as to remove ionic contaminants.

Step B: the cleaned 6H—SiC was placed into the quartz tube 5, and the quartz tube was placed into the resistance furnace 6; the air tightness of the whole preparation device was checked, then Ar gas was introduced from the gas inlet 4 at a flow rate of 80 ml/min, while controlling Ar gas to enter into the quartz tube through the first channel 1 by the three-way valve 3, and the quartz tube was degassed for 30 minutes so as to discharge the air inside the quartz tube from the gas outlet 7; and the power of the resistance furnace 6 was turned on to elevate the temperature of the quartz tube to 1150° C.

Step C: the power of the water bath 9 was turned on so as to heat the three-necked flask 8 containing $CCl_4$ liquid to 80° C.; the three-way valve was rotated when the temperature of the resistance furnace reached a predetermined temperature of 1150° C. so that Ar gas entered into the three-necked flask through the second channel 2 at a flow rate of 90 ml/min and carried $CCl_4$ vapor into the quartz tube, allowing gaseous $CCl_4$ to react with 6H—SiC in the quartz tube for 100 minutes, thereby generating a double-layered carbon film.

Step D: a Si substrate was loaded on the slide of an electron beam evaporation coating machine, wherein the distance between the substrate and the target was set to 50 cm, the chamber pressure was pumped to $5\times10^{-4}$ Pa, the beam current was adjusted to 40 mA, and the evaporation lasted for 20 minutes. As a result, a metal film of Ni with a thickness of 600 nm was deposited on the Si substrate.

Step E: the resultant double-layered carbon film sample was taken out of the quartz tube and placed onto the metal film; followed by annealing the carbon film sample and the metal film as a whole in an Ar atmosphere (flow rate: 100 ml/min) at 1100° C. for 10 minutes so as to catalyze the double-layered carbon film to reconstitute into continuous graphene by metal Ni; and the metal film was removed from the double-layered graphene sample.

The graphene as obtained by the preparing process in accordance with the present invention has a smooth surface and a low porosity, and thus can be used for gas sealing and liquid sealing. In addition, the graphene of the present invention can be rolled up into a cylinder so as to obtain carbon nanotube for restoring hydrogen gas. The graphene of the present invention can also be used to prepare high-speed graphene transistors and transparent conductive films.

What is claimed is:

1. A process for preparing graphene on a SiC substrate, based on metal film-assisted annealing, comprising the following steps:
    (1) subjecting a SiC substrate to a standard cleaning process so as to remove contaminants from the surface of the SiC substrate;
    (2) placing the cleaned SiC substrate into a quartz tube and heating the quartz tube up to a temperature of 750 to 1150° C.; and introducing $CCl_4$ vapor into the quartz tube to react with SiC for a period of 20 to 100 minutes so as to generate a double-layered carbon film, wherein the $CCl_4$ vapor is carried by Ar gas;
    (3) forming a metal film with a thickness of 350 to 600 nm on a Si substrate by electron beam deposition, wherein the metal film is capable of catalyzing carbon to reconstitute into graphene;
    (4) placing the obtained double-layered carbon film sample onto the metal film, and subsequently annealing them in an Ar atmosphere at a temperature of 900 to 1100° C. for 10-30 minutes so as to reconstitute the double-layered carbon film into double-layered graphene; and
    (5) removing the metal film from the double-layered graphene, and thereby obtaining double-layered graphene.

2. The process for preparing graphene according to claim 1, characterized in that step (1) subjecting a SiC substrate to a standard cleaning process is carried out by:
    (1a) immersing the SiC substrate in a medium of $NH_4OH+H_2O_2$ for 10 minutes, taking the SiC substrate out and drying it so as to remove organic residues from the surface of the SiC substrate; and
    (1b) immersing the SiC substrate in a medium of $HCl+H_2O_2$ for 1 minutes, taking the SiC substrate out and drying it so as to remove ionic contaminants.

3. The process for preparing graphene according to claim 1, characterized in that the flow rate of Ar gas in step (2) is 40 to 90 ml/min.

4. The process for preparing graphene according to claim 1, characterized in that the electron beam deposition in step (3) is carried out under the following conditions: the distance between the SiC substrate and the target being 50 cm, the chamber pressure being $5\times10^{-4}$ Pa, the beam current being 40 mA, and the evaporation time being 10 to 20 minutes.

5. The process for preparing graphene according to claim 1, characterized in that the flow rate of Ar gas during annealing in step (4) is 20-100 ml/min.

6. The process for preparing graphene according to claim 1, characterized in that the SiC substrate is in a crystal form of 4H—SiC or 6H—SiC.

7. The process for preparing graphene according to claim 1, characterized in that the $CCl_4$ vapor in step (2) is obtained by heating $CCl_4$ liquid to a temperature of 60 to 90° C.

8. The process for preparing graphene according to claim 1, characterized in that the metal film is a Ni film.

* * * * *